US008816529B2

(12) United States Patent
Hofheinz

(10) Patent No.: US 8,816,529 B2
(45) Date of Patent: Aug. 26, 2014

(54) DEVICE FOR MONITORING THE INSULATION OF A NON-GROUNDED ELECTRICAL DC GRID, PARTICULARLY A PHOTOVOLTAIC SYSTEM, AND SYSTEM COMPRISING SUCH A DEVICE

(75) Inventor: Wolfgang Hofheinz, Gruenberg (DE)

(73) Assignee: Bender GmbH & Co. KG, Gruenberg (DE)

( * ) Notice: Subject to any disclaimer, the term of this patent is extended or adjusted under 35 U.S.C. 154(b) by 549 days.

(21) Appl. No.: 13/216,634

(22) Filed: Aug. 24, 2011

(65) Prior Publication Data

US 2012/0049630 A1    Mar. 1, 2012

(30) Foreign Application Priority Data

Aug. 24, 2010  (DE) .......................... 10 2010 039 692

(51) Int. Cl.
*H02J 3/38*       (2006.01)
(52) U.S. Cl.
USPC .......................................................... 307/19
(58) Field of Classification Search
USPC .......................................................... 307/19
See application file for complete search history.

(56) References Cited

U.S. PATENT DOCUMENTS

| 6,392,422 B1 | 5/2002 | Kammer et al. |
| 2006/0187074 A1 | 8/2006 | O'Sullivan et al. |

FOREIGN PATENT DOCUMENTS

| CN | 201383701 Y | 1/2010 |
| DE | 43 39 946 A1 | 6/1995 |
| DE | 102009008047 A1 | 8/2010 |
| EP | 0 990 292 B1 | 4/2003 |
| ES | 2179834 T3 | 2/2003 |
| ES | 2196582 T3 | 12/2003 |
| WO | 2009120537 A1 | 10/2009 |

OTHER PUBLICATIONS

Spanish Patent Office Search Report filed in a parallel application, dated Sep. 24, 2013.

*Primary Examiner* — Robert L. Deberadinis
(74) *Attorney, Agent, or Firm* — Griffin & Szipl, P.C.

(57) ABSTRACT

The invention relates to an insulation monitoring device (IMD) in a non-grounded electrical DC grid (DC-IT System), particularly an electrical photovoltaic system (PV). Said device has a power supply unit (B), which is supplied with electrical energy from the electrical DC grid (DC-IT System). According to the invention a rechargeable energy store ($C_{IMD}$) is present, in particular a capacitor with a charging diode (D) connected upstream. This is supplied with electrical energy ($U_{IMD}$) via the electrical DC grid and supplies the power supply unit (B) in the event of a temporary failure of the electrical DC grid, so that continued operation of the insulation monitoring device (IMD) is possible until the non-grounded electrical DC grid is re-established. Advantageously, for continued operation of the insulation monitoring in the event of failure of the electrical DC grid the power supply unit (B) provides a preferably pulsed measurement voltage ($U_P$), which is used in order to feed electrical energy into the electrical DC grid (DC-IT) via a coupling circuit (AS).

19 Claims, 2 Drawing Sheets

DEVICE FOR MONITORING THE INSULATION OF A NON-GROUNDED ELECTRICAL DC GRID, PARTICULARLY A PHOTOVOLTAIC SYSTEM, AND SYSTEM COMPRISING SUCH A DEVICE

This application claims priority from German Patent Application No. 10 2010 039 692.3, filed Aug. 24, 2010, the entire disclosure of which is incorporated herein by reference.

The invention relates to a device for monitoring the insulation in a non-grounded grid for providing DC voltage, in particular from an electrical photovoltaic system, comprising a power supply unit which is supplied with electrical energy from the non-grounded electrical DC grid.

The monitoring of a non-grounded electrical DC grid, in which the insulation monitoring device is operated by the voltage of the grid to be monitored itself, is naturally only in operation when the grid itself is available. This problem is particularly significant when frequent or even cyclical failures of both the supplying grid and the grid to be monitored occur. Thus e.g. a non-grounded electrical DC grid which is supplied by an electrical photovoltaic system, i.e. a possibly large panel consisting of a plurality of interconnected photovoltaic cells, cuts out for long periods every night, but also in deep twilight or adverse weather conditions. In these periods, damage caused by e.g. weather effects such as hailstorms, but also by people and machines, can occur to a photovoltaic system possibly extending over a large area, and can adversely affect the condition of the insulation relative to the ground potential.

In non-grounded electrical DC grids such insulation faults are well known to particularly problematic when the insulation resistance of not only one active conductor relative to ground is impermissibly reduced, i.e. an asymmetrical insulation fault is present, but when the insulation resistance of both conductors relative to ground is impermissibly reduced, i.e. a symmetrical insulation fault is present. The danger then exists of a fire occurring, which can have serious consequences e.g. in electrical photovoltaic systems which are installed on rooves of houses.

Figure 1:
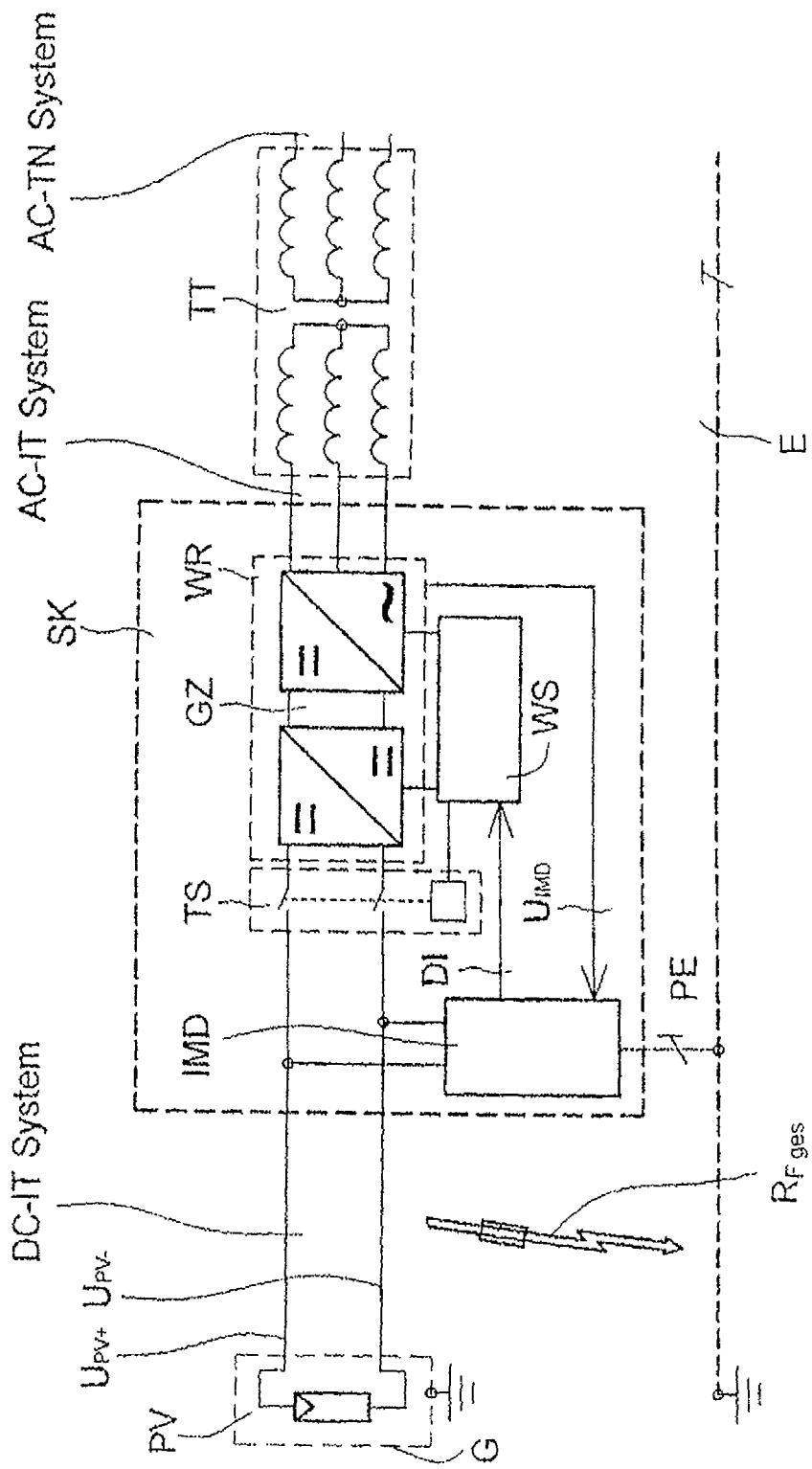

FIG. 1 shows the known construction of an insulated, i.e. non-grounded, electrical DC grid (DC-IT System) based on the example of an electrical photovoltaic cell or of an electrical photovoltaic system composed of a panel of such photovoltaic cells PV. The electrical energy provided thereby is fed by an inverter WR first into a non-grounded electrical DC grid (AC-IT System) and then transferred by means of an isolating transformer TT into an electrical AC grid (AC-TN System) with a grounded neutral.

The cells of the exemplary photovoltaic system PV, which are mounted in a grounded housing G, supply an insulated electrical DC grid (DC-IT System). This is represented by the positive and negative poles of the grid voltage $U_{PV+}$ and $U_{PV-}$, relative to the ground reference potential E. The condition of the insulation of this arrangement, e.g. in the form of the total insulation resistance $R_{Fges}$ is monitored using an insulation monitoring device IMD by tapping off and evaluating the positive and negative potentials $U_{PV+}$ and $U_{PV-}$ of the grid voltage. If impermissibly low values are found, then the inverter WR can be switched off and decoupled from the electrical DC grid DC-IT via an isolating contactor TS. For this purpose the insulation monitoring device IMD is connected via a digital data interface DI to an inverter controller WS.

The necessary electrical energy to operate the insulation monitoring device IMD can be obtained from the electrical DC grid (DC-IT System) in different ways. To achieve this in the example of FIG. 1 the inverter WR provides a supply DC voltage $U_{IMD}$. Since the inverter WR in the example illustrated has a DC voltage intermediate circuit GZ, the supply DC voltage $U_{IMD}$ is also sometimes tapped off there. The entire arrangement SK consisting of the insulation monitoring device IMD, the inverter WR with inverter controller WS and isolating contactor TS, can also be referred to as an "inverter with safety wiring" for the insulated electrical DC grid (DC-IT System) and can represent a stand-alone module.

The problem addressed by the invention is to extend an insulation monitoring device or a system which contains an insulation monitoring device with a downstream inverter in such a manner that insulation monitoring can be maintained even in the event of a temporary failure of the non-grounded electrical DC grid, until it is re-established.

The problem is solved with the device specified in Claim 1. Advantageous further configurations of the invention are specified in the dependent claims referring thereto. The problem is further solved with the system specified in Claim 5, which simply contains a device according to Claim 1 or the dependent claims referring thereto.

The invention offers the particular advantage that permanent insulation monitoring is possible also when the electrical DC grid to be monitored has either no, or too low a grid voltage. This is particularly useful when monitoring the insulation condition of an insulated electrical DC grid provided by an electrical photovoltaic system, e.g. at night or in unfavourable light irradiation conditions.

Furthermore, the signalling of insulation faults at all times is not the only possibility. Rather, on the occurrence of an insulation fault in a photovoltaic system e.g. at night, connection and restarting of the inverter can be prevented in spite of adequate sunlight on the following morning. This means that the operational safety of a photovoltaic system can be considerably improved.

Figure 2:
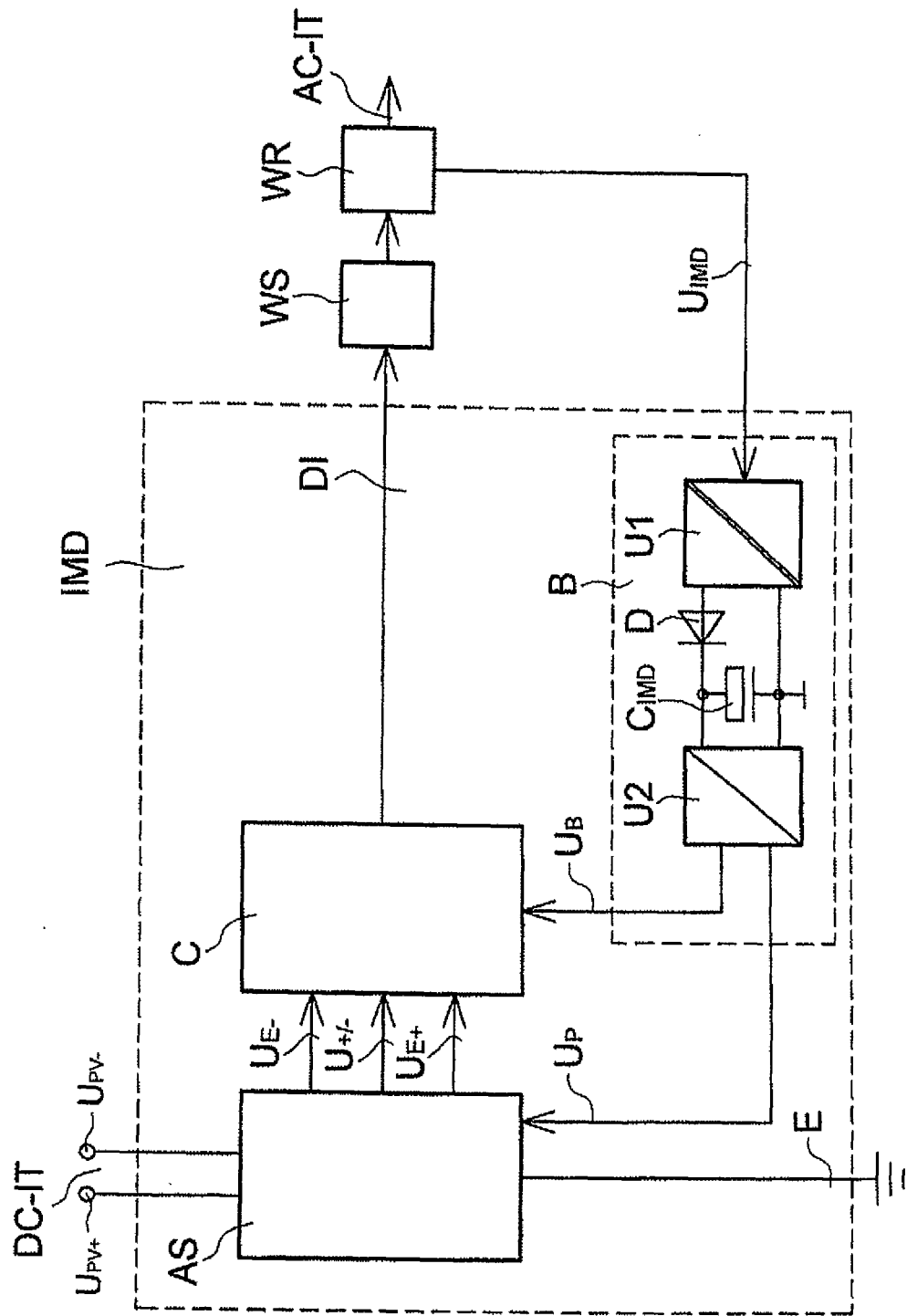

The invention and further advantageous embodiments of the same are explained in more detail below with the aid of an exemplary embodiment illustrated in the drawings. They show:

FIG. 1 the known structure of an example system having a non-grounded electrical DC grid which is supplied by an electrical photovoltaic system, and which is equipped with an insulation monitoring device, and FIG. 2 a particularly advantageous embodiment of an insulation monitoring device constructed according to the present invention.

The insulation monitoring device IMD shown in the example of FIG. 2 and constructed according to the invention has a coupling circuit AS, a control unit C, also known as a controller, and a power supply unit B as hardware components.

By means of the coupling circuit AS the positive and negative potentials $U_{PV+}$ and $U_{PV-}$ of the phase-to-phase voltage between the conductors of the insulated electrical DC grid (DC-IT System) relative to the ground reference potential E are detected. For this purpose the coupling circuit AS preferably has a network of coupled resistors from which it advantageously derives the measurement voltages $U_{E-}$ and $U_{E+}$ between the negative and positive pole of the voltage of the insulated electrical DC grid and ground, or the phase-to-phase measurement voltage $U_{+/-}$ between the poles of the voltage.

These measurement voltages are passed to a controller C for analysis, which detects therefrom the current insulation condition of the non-grounded electrical DC grid (DC-IT System), particularly the total insulation resistance thereof, $R_{Fges}$. If impermissibly low values are detected, indicating an insulation fault, then the insulation monitoring device IMD can intervene via a data interface DI in the inverter controller WS and cause, e.g., the inverter WR to switch off or to be decoupled from the electrical DC grid DC-IT.

According to the invention, the power supply unit B of the insulation monitoring device IMD is equipped with a rechargeable energy store $C_{IMD}$, which in the example illustrated is embodied as a capacitor with a charging diode D connected upstream. This is charged up for as long as the electrical DC grid (DC-IT System) provides a DC voltage at a sufficient level, which in the example of FIG. 2 means as long as the electrical photovoltaic system PV is active. If this fails, e.g. in twilight, at night or under adverse weather conditions, then the rechargeable energy store $C_{IMD}$ assumes the buffering of the power supply unit B. Further operation of the insulation monitoring device IMD is thus possible until the electrical DC grid DC-IT returns to normal and is again able to supply electrical energy.

In the example of FIG. 2 the power supply unit 1 does not only provide an operating voltage $U_B$ for supplying the controller C. In addition, a measurement voltage $U_P$ is provided and fed to the coupling circuit AS. This means that even if the electrical DC grid (DC-IT System) fails, electrical measurement energy can be fed into its conductors in order to enable continued operation of the insulation monitoring according to the invention until the re-establishment of the DC voltage in the grid.

Depending on the design of the coupling circuit AS, the measurement voltage $U_P$ can also be pulsed. The periodic monitoring of the insulation condition of the electrical DC grid at specific time intervals which this produces has the advantage that a lesser loading of the rechargeable energy store $C_{IMD}$ occurs. Therefore, any longer lasting outage periods of the electrical DC grid which may occur can also be bridged. In an electrical photovoltaic system PV according to the example of FIG. 2 such longer outage periods can occur, e.g. in winter.

In the embodiment according to the example of FIG. 2 the rechargeable energy store $C_{IMD}$ is advantageously integrated directly into the power supply unit B. For the purpose, this has a DC voltage transformer U2 for supplying the hardware components AS and C of the insulation monitoring device IMD. The rechargeable energy store $C_{IMD}$ is connected upstream of the input to U2. Both components are supplied with electrical energy via the non-grounded electrical DC grid DC-IT. In the example of FIG. 2 a DC supply voltage $U_{IMD}$ is provided by the inverter WR for this purpose, e.g. from an intermediate circuit of the same.

In a further embodiment, already illustrated in the example of FIG. 2, a switching power supply unit U1 is connected upstream of the DC voltage transformer U2 and the rechargeable energy store $C_{IMD}$. This results in an advantageous galvanic isolation of the power supply unit B.

The invention claimed is:

1. Device for monitoring the insulation resistance (IMD) of a non-grounded grid for providing DC voltage (DC-IT), in particular composed of an electrical photovoltaic system (PV), having
    a) a power supply unit (B) which is supplied with electrical energy from the non-grounded electrical DC grid (DC-IT System),
    characterized by
    b) a rechargeable energy store ($C_{IMD}$), which
        b1) is supplied with electrical energy ($U_{IMD}$) via the non-grounded electrical DC grid (DC-IT System), and which
        b2) supplies the power supply unit (B) in the event of a temporary failure of the non-grounded electrical DC grid (DC-IT System), so that continued operation of the insulation monitoring device (IMD) is possible until the non-grounded electrical DC grid (DC-IT System) is re-established.

2. The device according to claim 1, wherein in order to enable continued operation of the insulation monitoring in the event of a temporary failure of the non-grounded electrical DC grid (DC-IT System), the power supply unit (B) provides a measurement voltage ($U_p$), which is used to supply electrical energy into the electrical DC grid (DC-IT System), in particular via a coupling circuit (AS).

3. The device according to claim 2, wherein the measurement voltage ($U_p$) fed into the non-grounded electrical DC grid (DC-IT System) is pulsed.

4. The device according to claim 3, wherein the power supply unit (B)
    a) has a DC voltage transformer (U2) for supplying hardware components (AS, C) of the insulation monitoring device (IMD), which is supplied with electrical energy ($U_{IMD}$) via the non-grounded electrical DC grid (DC-IT System), and
    b) the rechargeable energy store ($C_{IMD}$) is connected upstream of the input to the DC voltage transformer (U2).

5. The device according to claim 3, wherein the rechargeable energy store ($C_{IMD}$) is embodied as a capacitor with a charging diode (D) connected upstream.

6. System with a device for insulation monitoring (IMD) according to claim 3, which has
    a) an inverter (WR) which feeds the electrical energy provided by the non-grounded electrical DC grid (DC-IT System) into a non-grounded electrical AC voltage grid (AC-IT), and wherein
    b) the rechargeable energy store ($C_{IMD}$) is supplied with electrical energy ($U_{IMD}$) via the inverter (WR).

7. The device according to any claim 2, wherein the power supply unit (B)
    a) has a DC voltage transformer (U2) for supplying hardware components (AS, C) of the insulation monitoring device (IMD), which is supplied with electrical energy ($U_{IMD}$) via the non-grounded electrical DC grid (DC-IT System), and
    b) the rechargeable energy store ($C_{IMD}$) is connected upstream of the input to the DC voltage transformer (U2).

8. The device according to claim 2, wherein the rechargeable energy store ($C_{IMD}$) is embodied as a capacitor with a charging diode (D) connected upstream.

9. System with a device for insulation monitoring (IMD) according to claim 2, which has
    a) an inverter (WR) which feeds the electrical energy provided by the non-grounded electrical DC grid (DC-IT System) into a non-grounded electrical AC voltage grid (AC-IT), and wherein
    b) the rechargeable energy store ($C_{IMD}$) is supplied with electrical energy ($U_{IMD}$) via the inverter (WR).

10. The device according to claim 1, wherein the power supply unit (B)
    a) has a DC voltage transformer (U2) for supplying hardware components (AS, C) of the insulation monitoring device (IMD), which is supplied with electrical energy ($U_{IMD}$) via the non-grounded electrical DC grid (DC-IT System), and b) the rechargeable energy store ($C_{IMD}$) is connected upstream of the input to the DC voltage transformer (U2).

11. The device according to claim 10, wherein in the power supply unit (B)
    a) a switching power supply unit (U1) is connected upstream of the DC voltage transformer (U2) and is supplied with electrical energy ($U_{IMD}$) via the non-grounded electrical DC grid (DC-IT System), and
    b) the rechargeable energy store ($C_{IMD}$) is connected in parallel between the combination of DC voltage transformer (U2) and switching power supply unit (U1).

12. The device according to claim 11, wherein the rechargeable energy store ($C_{IMD}$) is embodied as a capacitor with a charging diode (D) connected upstream.

13. System with a device for insulation monitoring (IMD) according to claim 11, which has
    a) an inverter (WR) which feeds the electrical energy provided by the non-grounded electrical DC grid (DC-IT System) into a non-grounded electrical AC voltage grid (AC-IT), and wherein
    b) the rechargeable energy store ($C_{IMD}$) is supplied with electrical energy ($U_{IMD}$) via the inverter (WR).

14. The device according to claim 10, wherein the rechargeable energy store ($C_{IMD}$) is embodied as a capacitor with a charging diode (D) connected upstream.

15. System with a device for insulation monitoring (IMD) according to claim 10, which has
    a) an inverter (WR) which feeds the electrical energy provided by the non-grounded electrical DC grid (DC-IT System) into a non-grounded electrical AC voltage grid (AC-IT), and wherein
    b) the rechargeable energy store ($C_{IMD}$) is supplied with electrical energy ($U_{IMD}$) via the inverter (WR).

16. The device according to claim 1, wherein the rechargeable energy store ($C_{IMD}$) is embodied as a capacitor with a charging diode (D) connected upstream.

17. System with a device for insulation monitoring (IMD) according to claim 16, which has
    a) an inverter (WR) which feeds the electrical energy provided by the non-grounded electrical DC grid (DC-IT System) into a non-grounded electrical AC voltage grid (AC-IT), and wherein
    b) the rechargeable energy store ($C_{IMD}$) is supplied with electrical energy ($U_{IMD}$) via the inverter (WR).

18. System with a device for insulation monitoring (IMD) according to claim 1, which has
    a) an inverter (WR) which feeds the electrical energy provided by the non-grounded electrical DC grid (DC-IT System) into a non-grounded electrical AC voltage grid (AC-IT), and wherein
    b) the rechargeable energy store ($C_{IMD}$) is supplied with electrical energy ($U_{IMD}$) via the inverter (WR).

19. The system according to claim 18, wherein the inverter (WR) has a DC voltage intermediate circuit (GZ), from which the electrical energy ($U_{IMD}$) is tapped off to supply the rechargeable energy store ($C_{IMD}$).

* * * * *